United States Patent
Collard et al.

(10) Patent No.: US 7,507,620 B2
(45) Date of Patent: Mar. 24, 2009

(54) LOW-CAPACITY VERTICAL DIODE

(75) Inventors: Emmanuel Collard, Tours (FR); Patrick Poveda, Villedomer (FR)

(73) Assignee: STMicroelectronics S.A., Montrouge (FR)

( * ) Notice: Subject to any disclaimer, the term of this patent is extended or adjusted under 35 U.S.C. 154(b) by 72 days.

(21) Appl. No.: 11/159,991

(22) Filed: Jun. 23, 2005

(65) Prior Publication Data

US 2005/0242363 A1 Nov. 3, 2005

Related U.S. Application Data

(62) Division of application No. 10/489,153, filed as application No. PCT/FR02/03080 on Sep. 10, 2002, now Pat. No. 6,924,546.

(30) Foreign Application Priority Data

Sep. 10, 2001 (FR) .................................. 01 11680

(51) Int. Cl.
  *H01L 21/8234* (2006.01)
(52) U.S. Cl. ................ 438/237; 438/328; 257/E29.329
(58) Field of Classification Search ................ 438/237, 438/141, 328, 380; 257/E29.329
See application file for complete search history.

(56) References Cited

U.S. PATENT DOCUMENTS

| | | | | |
|---|---|---|---|---|
| 4,007,104 A | * | 2/1977 | Summers et al. | 438/713 |
| 4,639,756 A | * | 1/1987 | Rosbeck et al. | 257/442 |
| 4,811,080 A | | 3/1989 | Richards | |
| 5,119,148 A | * | 6/1992 | Anderson et al. | 257/496 |
| 5,559,336 A | * | 9/1996 | Kosai et al. | 250/370.13 |
| 5,646,426 A | * | 7/1997 | Cockrum et al. | 257/188 |
| 6,021,149 A | * | 2/2000 | Miyazaki et al. | 372/50.1 |
| 6,060,757 A | * | 5/2000 | Losehand et al. | 257/471 |
| 6,251,501 B1 | | 6/2001 | Higdon et al. | |
| 6,303,979 B1 | | 10/2001 | Kasahara | |
| 6,790,701 B2 | * | 9/2004 | Shigenaka et al. | 438/93 |
| 2002/0011640 A1 | * | 1/2002 | Bauer et al. | 257/443 |
| 2004/0095205 A1 | | 5/2004 | Schaffner et al. | |

FOREIGN PATENT DOCUMENTS

FR 2 559 959 8/1985

OTHER PUBLICATIONS

International Search Report from the corresponding PCT Application No. PCT/FR02/03080, filed Sep. 10, 2002.

* cited by examiner

*Primary Examiner*—H. Jey Tsai
(74) *Attorney, Agent, or Firm*—Lisa K. Jorgenson; James H. Morris; Wolf, Greenfield & Sacks, P.C.

(57) ABSTRACT

A vertical diode of low capacitance formed in a front surface of a semiconductor substrate, including a first area protruding from the substrate surface including at least one doped semiconductor layer of a conductivity type opposite to that of the substrate, the upper surface of the semiconductor layer supporting a first welding ball. The diode includes a second area including on the substrate a thick conductive track supporting at least two second welding balls, said first and second welding balls defining a plane parallel to the substrate plane.

36 Claims, 2 Drawing Sheets

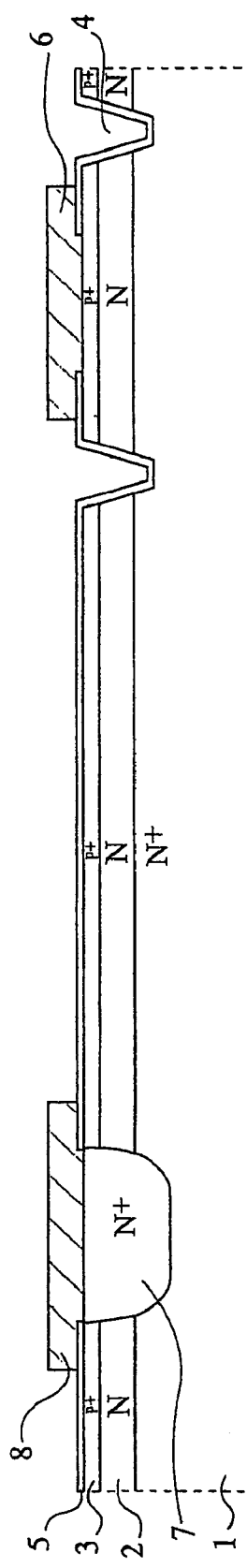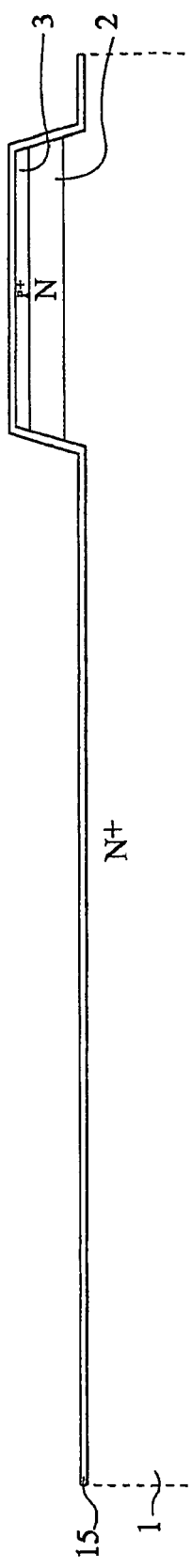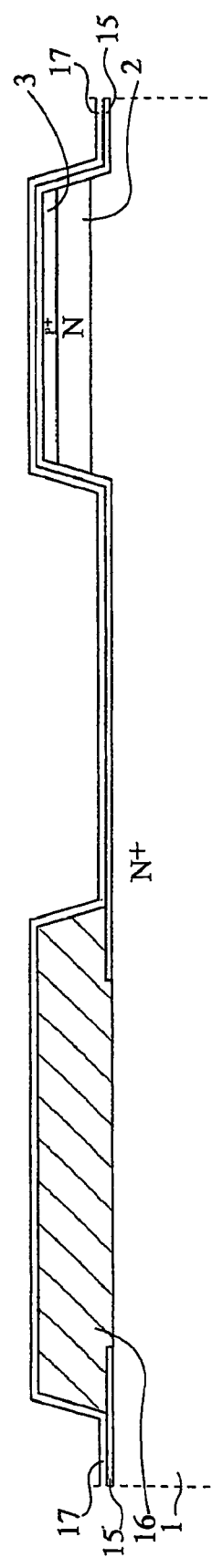

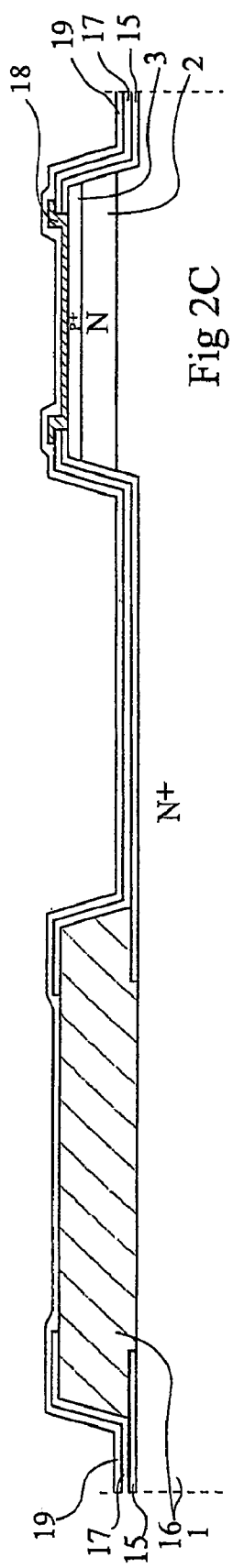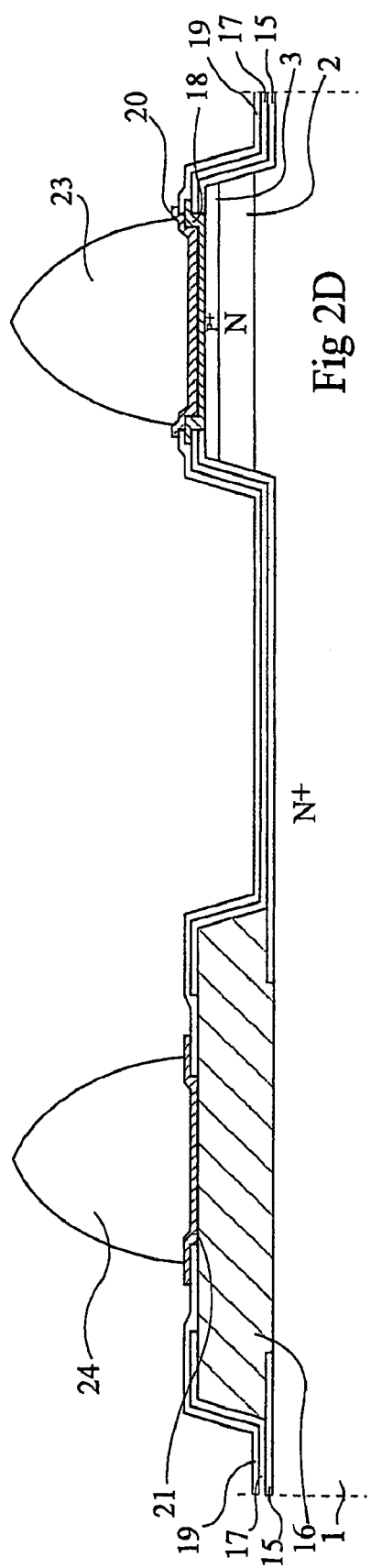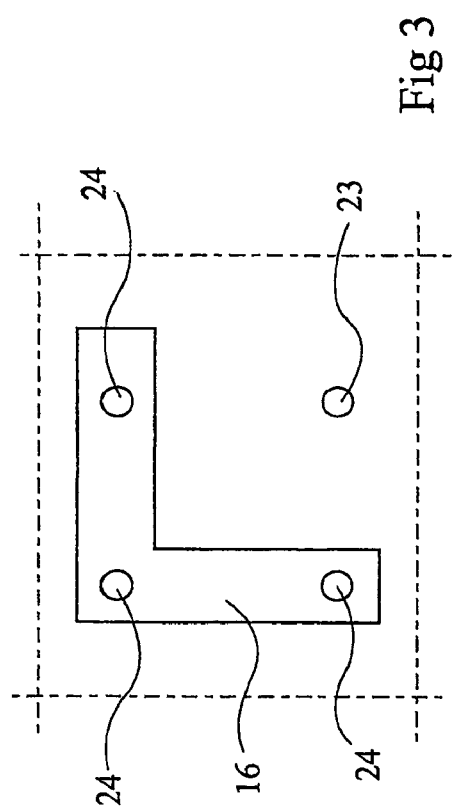

LOW-CAPACITY VERTICAL DIODE

RELATED APPLICATIONS

This application is a division of prior application Ser. No. 10/489,153, filed on Mar. 10, 2004, entitled LOW-CAPACITANCE VERTICAL DIODE and now issued as U.S. Pat. No. 6,924,546.

BACKGROUND OF THE INVENTION

1. Field of the Invention

The present invention generally relates to the forming of diodes having low capacitance and low series resistance in semiconductor wafers. More specifically, the present invention relates to the forming of diodes having all their contacts on the front surface side in a semiconductor wafer. Such diodes are useful in certain high-frequency (radio-frequency) applications.

2. Discussion of the Related Art

A method for manufacturing a diode having reduced capacitance is described hereafter in relation with FIG. 1 in the case of a PIN-type diode.

A heavily-doped semiconductor substrate 1, generally single-crystal silicon, of a first conductivity type, for example, N-type, is used. The method starts with the epitaxial growth, on substrate 1, of a layer 2 of same conductivity type N as substrate 1, but more lightly doped. A heavily-doped layer 3 of the opposite conductivity type, for example, P-type, is then formed. To exhibit a reduced capacitance, the diode must have a reduced surface area. The diode surface area is limited by digging a peripheral groove 4. Groove 4 is dug to at least reach substrate 1. Groove 4 generally has a depth at least equal to the height of layers 2 and 3. The entire structure is then coated with an insulating layer 5, typically silicon oxide. Insulating layer 5 is then opened in the diode region delimited by groove 4. A conductive material, typically aluminum, is deposited and etched, to form an anode contact 6 with layer 3. A cathode contact (not shown) is subsequently formed by a metallization on the rear surface of substrate 1.

To obtain a front surface assembly diode, it could be devised to directly form a cathode contact by opening, as illustrated in FIG. 1, insulating layer 5 outside of the region delimited by groove 4, to partially expose layer 3. Layer 5 would then be used as an implantation mask to form a heavily-doped region 7 of the same conductivity type, N, as substrate 1. Region 7 would be formed sufficiently deeply to reach substrate 1 and form a cathode contacting area. A cathode contact 8 would then be formed on region 7, at the front surface, at the same time as anode contact 6.

However, the forming of deep heavily-doped region 7 requires an additional anneal. To obtain a PIN diode of good quality, the transition between substrate 1 and layer 2 and the junction between layers 2 and 3 must be particularly steep. The diffusion anneal would adversely affect the diode characteristics (capacitance, series resistance, breakdown voltage).

SUMMARY OF THE INVENTION

The present invention aims at providing a vertical diode having reduced or low capacitance to be assembled on the front surface of a semiconductor substrate.

The present invention also aims at providing a method for manufacturing such a diode which avoids the above-mentioned disadvantages.

To achieve these and other objects, the present invention provides a vertical diode of low or reduced capacitance formed in a front surface of a semiconductor substrate, including a first area protruding from the substrate surface including at least one doped semiconductor layer of a conductivity type opposite to that of the substrate, the upper surface of the semiconductor layer supporting a first welding ball; and a second area including on the substrate a thick conductive track supporting at least two second welding balls, said first and second welding balls defining a plane parallel to the substrate plane.

According to an embodiment of the present invention, the second area includes an intermediary semiconductor layer between the substrate and the semiconductor layer.

According to an embodiment of the present invention, the welding balls rest on a bonding surface.

According to an embodiment of the present invention, the first area includes a metallization between the semiconductor layer and the bonding surface of the first welding ball.

The present invention also provides a method for manufacturing a vertical diode having a low or reduced capacitance and formed in a front surface of a semiconductor substrate of a first conductivity type forming a first electrode of the diode, including the steps of forming a semiconductor layer of the second conductivity type; digging, outside of the diode-forming region, at least until the substrate is exposed; forming on the substrate a conductive track having a thickness substantially greater than the digging depth; forming a metallization on a portion of the semiconductor layer forming a second electrode of the diode; and simultaneously forming a welding ball on said metallization and at least two welding balls on the track, said welding balls defining a plane parallel to the substrate plane.

According to an embodiment of the present invention, the digging step includes removing the multiple-layer formed by the semiconductor layer and the substrate everywhere except on the diode-forming region.

According to an embodiment of the present invention, the digging step includes removing the multiple-layer formed by the semiconductor layer and the substrate, on the one hand, at the diode periphery and, on the other hand, at a distant location in which is subsequently formed the conductive track.

According to an embodiment of the present invention, the step of forming a semiconductor layer of the second conductivity type is preceded by forming, on the substrate, a semiconductor layer of the first conductivity type more lightly doped than the substrate.

According to an embodiment of the present invention, the step of forming the metallization includes opening a window in an insulating structure covering the second electrode and of depositing a conductive material in and around said window.

According to an embodiment of the present invention, the step of simultaneous forming of the first and second welding balls includes the steps of opening an insulating structure covering the thick track as well as an insulating structure covering the metallization; depositing and etching a conductive material to form on the metallization a first bonding surface and on the track at least two second bonding surfaces, the first and second bonding surfaces being coplanar; and simultaneously depositing on each of the bonding surfaces a conductive material to form a welding ball.

The foregoing objects, features and advantages of the present invention will be discussed in detail in the following non-limiting description of specific embodiments in connection with the accompanying drawings.

BRIEF DESCRIPTION OF THE DRAWINGS

FIG. 1 illustrates, in a simplified and partial cross-section view, a vertical PIN diode;

FIGS. 2A to 2D illustrate, in a simplified partial cross-section view, different steps of formation of a vertical diode of small capacitance with a front surface assembly according to an embodiment of the present invention; and FIG. 3 is a simplified partial top view of the diode of FIG. 2D.

DETAILED DESCRIPTION

For clarity, the same elements have been designated with the same references in the different drawings. Further, as usual in the field of semiconductor representation, the various drawings are not to scale.

An embodiment of a vertical diode of small capacitance to be assembled by its front surface according to the present invention will be discussed hereafter in relation with FIGS. 2A to 2D and 3.

A vertical diode of small capacitance, and thus of small surface area, is desired to be formed in a semiconductor substrate 1, for example, single-crystal silicon, heavily doped of a first conductivity type, for example, N. It is assumed hereafter, as a non-limiting example, that the diode is of PIN type.

As illustrated in FIG. 2A, a lightly-doped single-crystal silicon layer 2 of the same conductivity type N as substrate 1 is first formed, for example, by epitaxial growth. A heavily-doped P-type single-crystal silicon layer 3 is then formed. The diode surface is defined by digging into the multiple-layer formed of layers 3 and 2 and of substrate 1. This digging may be performed over a relatively large surface area, as illustrated in FIG. 2A.

Accordingly, a multiple-layer formed of layer 3, of layer 2, and of substrate 1 which emerges from the substantially planar surface of substrate 1 has been formed. A vertical PIN diode has thus been delimited, having the remaining portion of layer 3 forming its anode and substrate 1 forming its cathode. The structure is then coated with an insulating layer 15.

As illustrated in FIG. 2B, layer 15 is selectively opened, to expose a portion of substrate 1. A conductive material is then deposited and etched to form a thick conductive track 16. The upper surface of track 16 slightly protrudes from the upper surface of anode 3 of the diode. Then, the structure is coated with an insulating layer 17.

As illustrated in FIG. 2C, layers 15 and 17 are then selectively opened to partially expose the upper surface of anode 3. A conductive layer is deposited and etched on anode 3 to form a metallization 18. The thickness of metallization 18 is such that its upper surface is coplanar to the upper surface of track 16. Then, the entire structure is covered with an insulating layer 19.

Preferably, as shown, before deposition of insulating layer 19, layer 17 is selectively opened to expose the upper surface of track 16. Thus, the insulator thickness covering track 16 is equal to the insulator thickness covering metallization 18.

At the next steps, illustrated in FIG. 2D, layer 19 is selectively opened to open a window above metallization 18 and windows above track 16. The dimensions of the windows thus opened are substantially equal. Then, a bonding layer is deposited and etched. Bonding surfaces 20 and 21 are thus formed with, respectively anode 3-18 and track 16. Bonding layers 20 and 21 are substantially coplanar. Finally, the process stops with the forming of welding balls 23 and 24 respectively on bonding surfaces 20 and 21. Welding balls 23 and 24 have substantially the same dimensions and are made of a material adapted to enabling welding with contact pads of a printed circuit or the like.

A diode including a contact 23 of anode 20-18-3, to the right of FIG. 2D and contacts 24 of cathode 21-16-1 on a same front surface as anode contact 23, to the left of FIG. 2D, has thus been formed.

Although a single contact 24 is visible in the cross-section view of FIG. 2D, in practice, at least two cathode contacts will be formed on track 16. For example, as illustrated by the top view of FIG. 3, track 16 may have a right angle shape and three cathode contacts 24 are formed on this track.

Accordingly, as appears from the foregoing description, a vertical diode, the surface area (capacitance) of which can be controlled and reduced or minimized has advantageously been obtained. Further, none of the operations described in relation with FIGS. 2B to 2D requires any thermal processing that might adversely affect the diode performance.

As a non-limiting example, the natures and dimensions of the different elements of a PIN diode according to an embodiment of the present invention are the following:

substrate 1: heavily-doped N-type single-crystal silicon;

layers 2 and 3: single-crystal silicon obtained by epitaxy, having a total thickness ranging from 6 to 8 μm;

digging of substrate 1 down to depth of, for example, from 7 to 9 μm;

insulating layer 15: multiple-layer formed of a thermal silicon oxide sub-layer and of an upper sub-layer of a phosphosilicate based glass (PSG);

conductive track 16: aluminum of a thickness from 8 to 10 μm;

windows of deposition of metallization 18 and/or of formation of bonding surfaces 20 and 21: 70 μm×70 μm;

anode metallization 18: aluminum having a thickness on the order of from 1 to 2 μm;

bonding surfaces 20 and 21: titanium, nickel, and gold alloy (TiNiAu);

welding balls 23 and 24: alloys such as PbSn, of a diameter from 50 to 100 μm.

The natures and dimensions of the different elements described in the preceding example are not limiting. Those skilled in the art will be able to appropriately modify them according to the technological process, for example, according to the dimensions desired for anode and cathode welding balls 23 and 24.

According to an embodiment not shown, in the digging step described in relation with FIG. 2A, epitaxial layers 3 and 2 and substrate 1 are dug into, on the one hand according to a groove delimiting the diode surface and, on the other hand, at a distant location where the cathode track is desired to be formed. Between this location and the groove, the multiple-layer formed of epitaxial layers 3, 2 and of substrate 1 remains in place.

Of course, the present invention is likely to have various alterations, modifications, and improvements which will readily occur to those skilled in the art. In particular, the present invention is not limited to the forming, previously described as a non-limiting example, of a PIN-type diode, but applies to the forming of any type of vertical diode with contacts on its upper surface. Further, the semiconductor substrate could correspond to the anode, and not to the cathode of the diode.

Further, it should be noted that the exact nature of the materials used may be modified in any appropriate manner, provided to keep their insulating or conductive property such as previously described. Thus, "substrate" designates any type of single-crystal semiconductor material. The substrate may be a solid material or a semiconductor layer obtained, for example, by epitaxial growth, at the surface of a massive substrate. It may also be a specifically doped region of such a solid substrate or of such an epitaxial layer. A multiple-layer of the same nature may also be substituted to any conductive or insulating layer. Further, the deposition of any layer may be preceded by the deposition of a bonding and/or etch stop layer.

Further, it has previously been assumed that the cathode track would have, in top view, a non-rectilinear shape. However, it may have any shape, even rectilinear, to form two cathode welding balls non-aligned with the anode welding ball.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a vertical diode having a low capacitance and formed in a front surface of a semiconductor substrate of a first conductivity type forming a first electrode of the diode, the substrate having a plane, the method comprising the steps of:
   forming a semiconductor layer of a second conductivity type;
   digging, outside of a diode forming region, to a digging depth at least until the substrate is exposed;
   forming, on the substrate, a conductive track having a thickness substantially greater than the digging depth, the conductive track having an upper surface onto which contact balls are formable;
   in a separate step from forming the conductive track, forming a metallization on a portion of the semiconductor layer forming a second electrode of the diode, the metallization having an upper surface onto which a contact ball is formable, the upper surface of the conductive track and the upper surface of the metallization being coplanar in a plane parallel to the substrate plane, and the metallization having a thickness; and
   simultaneously forming a first contact ball on said metallization and a second at least two contact balls on the track, the first contact ball and the second at least two contact balls defining a plane parallel to the substrate plane, wherein the thickness of the conductive track which is directly under the contact balls is greater than the thickness of the metallization.

2. The method of claim 1, wherein the digging step comprises removing the multiple-layer formed by the semiconductor layer and the substrate everywhere except on the diode-forming region.

3. The method of claim 1, wherein the digging step comprises removing the multiple-layer formed by the semiconductor layer and the substrate at the diode periphery, and removing the multi-layer formed by the semiconductor layer and the substrate at a distant location in which is subsequently formed the conductive track.

4. The method of claim 1, wherein the step of forming a semiconductor layer of the second conductivity type is preceded by the forming, on the substrate, of a semiconductor layer of the first conductivity type more lightly doped than the substrate.

5. The method of claim 1, wherein the step of forming the metallization comprises opening a window in an insulating structure covering the second electrode and of depositing a conductive material in and around said window.

6. The method of claim 1, wherein the step of simultaneous forming of the first contact ball and the second contact balls comprises the steps of:
   opening an insulating structure covering a thick track as well as an insulating structure covering the metallization;
   depositing and etching a conductive material to form on the metallization a first bonding surface and on the track at least two second bonding surfaces, the first and second bonding surfaces being coplanar; and
   simultaneously depositing on each of the bonding surfaces a conductive material to form contact balls.

7. A method of manufacturing a vertical diode on a semiconductor substrate of a first conductivity type, the method comprising:
   forming a first semiconductor layer of a second conductivity type above the substrate;
   removing a portion of the first semiconductor layer, resulting in a remaining portion of the first semiconductor layer that forms at least part of a first electrode of the diode;
   forming, on the substrate, a conductive track of conductive material, the substrate and the conductive track together forming at least part of a second electrode of the diode, and the conductive track having a thickness;
   forming a metallization on at least a portion of the remaining portion of the first semiconductor layer in a separate step from forming the conductive track, the metallization and the remaining portion together forming at least part of the first electrode, the metallization having a thickness, wherein a top surface of the conductive track and a top surface of the metallization are coplanar;
   forming a first contact ball over the metallization; and
   forming a second contact ball over the conductive track, wherein the thickness of the conductive track which is directly under the second contact ball is greater than the thickness of the metallization.

8. The method of claim 7, wherein removing a portion of the semiconductor region comprises digging, outside of a region within which the remaining portion is formed, to at least a depth at which the substrate is exposed.

9. The method of claim 8, wherein the conductive track has a thickness substantially greater than the digging depth.

10. The method of claim 7, wherein the forming of the conductive track comprises depositing the conductive material on the substrate.

11. The method of claim 7, wherein the diode is a vertical PIN diode.

12. The method of claim 7, wherein the diode has a relatively small capacitance.

13. The method of claim 7, wherein the first electrode of the diode has a relatively small surface area.

14. The method of claim 7, wherein the method does not include any thermal processing that adversely affects performance of the diode.

15. The method of claim 7, further comprising:
   prior to forming the first semiconductor region, forming, on the substrate, a second semiconductor layer of the first conductivity type more lightly doped than the substrate,
   wherein the forming of the first semiconductor region comprises forming the first semiconductor region on the second semiconductor region.

16. The method of claim 7, further comprising:
   forming a first bonding layer on the conductive track; and forming a second bonding layer on the metallization.

17. The method of claim 16, wherein dimensions of an upper surface area of the first bonding layer are substantially equal to dimensions of an upper surface area of the second bonding layer.

18. The method of claim 16, wherein an upper surface area of the first bonding layer and an upper surface area of the second bonding layer are substantially coplanar.

19. The method of claim 7, further comprising:
forming at least one region above the conductive track, each of the at least one region adapted to enable welding with contact pads.

20. The method of claim 7, further comprising:
forming a region above the metallization adapted to enable welding with contact pads.

21. The method of claim 19, further comprising:
concurrently to the forming of the region above the metallization, forming at least one region above the conductive track, each of the at least one region adapted to enable welding with contact pads.

22. The method of claim 1, wherein the step for forming a conductive track comprises depositing and etching a conductive material.

23. The method of claim 1, wherein the step of forming a first contact ball on said metallization and a second at least two contact balls on the track comprises simultaneously forming the first contact ball and the at least two second contact balls.

24. The method of claim 7, wherein forming a conductive track comprises depositing and etching a conductive material.

25. A method of manufacturing a vertical diode on a semiconductor substrate of a first conductivity type, the method comprising:
a step for forming a first semiconductor layer of a second conductivity type above the substrate;
a step for removing a portion of the semiconductor layer to leave a non-removed portion of the semiconductor layer that forms at least part of a first electrode of the diode;
a step for forming, on the substrate, a conductive track of conductive material to form at least part of a second electrode of the diode, the conductive track having a thickness;
a step for forming a metallization on at least a portion of the remaining portion of the semiconductor layer in a separate step from forming the conductive track, the metallization and the remaining portion together forming at least part of the first electrode, wherein an upper surface of the conductive track and an upper surface of the metallization are coplanar, and the metallization having a thickness;
a step for forming a first contact ball over the metallization; and
a step for forming a second contact ball over the conductive track, wherein the thickness of the conductive track which is directly under the second contact ball is greater than the thickness of the metallization.

26. A method of manufacturing a vertical diode of low capacitance in a front surface of a semiconductor substrate, the method comprising:
providing a semiconductor substrate having a first conductivity type and a front surface;
forming a region protruding from the substrate by a thickness, the region comprising a doped semiconductor layer of a second conductivity type opposite to the first conductivity type;
forming a metallization on an upper surface of the doped semiconductor layer, the metallization having a thickness, and supporting a first contact ball on the metallization; and
forming a conductive track on the substrate in a separate step from forming the metallization, the conductive track having a thickness substantially equal to the thickness of the region and having an upper surface supporting a second at least two contact balls, wherein an upper surface of the metallization supporting the first contact ball and the upper surface of the conductive track supporting the second at least two contact balls are coplanar and lie in a plane parallel to the front surface of the substrate, and wherein the thickness of the conductive track which is directly under the at least two contact balls is greater than the thickness of the metallization.

27. The method of claim 26, further comprising forming an intermediary semiconductor layer between the substrate and the semiconductor layer.

28. The method of claim 26, wherein forming the first and second contact areas comprises resting the first contact ball and the second at least two contact balls on a bonding surface.

29. The method of claim 28, wherein the metallization is between the semiconductor layer and the bonding surface of the first contact ball.

30. A method of forming a vertical diode in a front surface of a semiconductor substrate, the method comprising:
providing a semiconductor substrate having a first conductivity type and a surface;
forming a region protruding from the substrate, the region comprising a doped semiconductor layer of a second conductivity type different from the first conductivity type, forming a metallization on an upper surface of the doped semiconductor layer of a second conductivity type, the metallization having a thickness, and supporting a contact ball on the metallization; and
forming a conductive track having an upper surface supporting at least two contact balls in a separate step from forming the metallization, and the conductive track having a thickness, wherein the upper surfaces supporting the contact balls of the metallization and the conductive track are coplanar and lie in a plane parallel to the front surface of the substrate, and the thickness of the conductive track which is directly under the at least two contact balls is greater than the thickness of the metallization.

31. The method of claim 30, further comprising including an intermediary semiconductor layer between the substrate and the semiconductor layer.

32. The method of claim 30, wherein forming the first and second contact areas comprises resting the contact balls on a bonding surface.

33. The method of claim 30, wherein the metallization is between the semiconductor layer and the bonding surface of the contact ball of the first area.

34. The method of claim 30, wherein forming the first area comprises forming at least one N-type doped semiconductor.

35. The method of claim 30, wherein forming the first area comprises forming at least one P-type doped semiconductor.

36. The method of claim 30, wherein forming the second area comprises forming a conductive track to have a thickness that is substantially equal to a thickness of the protrusion of the first area from the substrate.

* * * * *